United States Patent
Morita et al.

(10) Patent No.: US 8,427,003 B2
(45) Date of Patent: Apr. 23, 2013

(54) ELECTRIC POWER SUPPLY DEVICE

(75) Inventors: Kazuki Morita, Osaka (JP); Masahiro Saito, Osaka (JP)

(73) Assignee: Panasonic Corporation, Osaka (JP)

( * ) Notice: Subject to any disclaimer, the term of this patent is extended or adjusted under 35 U.S.C. 154(b) by 87 days.

(21) Appl. No.: 13/262,723

(22) PCT Filed: Jun. 25, 2010

(86) PCT No.: PCT/JP2010/004230
§ 371 (c)(1),
(2), (4) Date: Oct. 3, 2011

(87) PCT Pub. No.: WO2011/001649
PCT Pub. Date: Jan. 6, 2011

(65) Prior Publication Data
US 2012/0025613 A1    Feb. 2, 2012

(30) Foreign Application Priority Data
Jun. 30, 2009  (JP) .................................. 2009-154963

(51) Int. Cl.
*B60L 1/00*    (2006.01)
(52) U.S. Cl.
USPC .......................................................... 307/9.1
(58) Field of Classification Search .................... 307/9.1
See application file for complete search history.

(56) References Cited

U.S. PATENT DOCUMENTS
7,380,891 B2    6/2008 Ohashi et al.

FOREIGN PATENT DOCUMENTS
| JP | 2005-028908 | 2/2005 |
| JP | 2008-141854 | 6/2008 |
| JP | 2009-053012 | 3/2009 |
| JP | 2009-092628 | 4/2009 |

OTHER PUBLICATIONS
International Search Report of PCT Application No. PCT/JP2010/004230, dated on Aug. 17, 2010.

*Primary Examiner* — Robert L. Deberadinis
(74) *Attorney, Agent, or Firm* — Panasonic Patent Center

(57) ABSTRACT

A power supply device includes an electric storage unit connected to a main power supply and a load via a charging circuit; and a control circuit connected to the main power supply, the charging circuit, a voltage detection circuit, and a current detection circuit. When the electric storage unit is charged up to a steady-state voltage Vcs of the electric storage unit, the control circuit controls the electric storage unit to be charged until the voltage Vc of the electric storage unit reaches a voltage for determining the property deterioration of the electric storage unit. During the charge process, the control circuit calculates at least one of the internal resistances and the capacitance of the electric storage unit to determine the property deterioration of the electric storage unit.

10 Claims, 5 Drawing Sheets

ELECTRIC POWER SUPPLY DEVICE

TECHNICAL FIELD

The present invention relates to a power supply device used as an emergency power supply which supplies electricity from its electric storage unit to a load when the main power supply suffers a voltage drop.

BACKGROUND ART

In order to address environmental issues and to improve fuel efficiency, hybrid cars (hereinafter, vehicles) equipped with both a motor and an engine have been on the market in recent years. These vehicles regenerate electricity during braking by using a vehicle braking system which employs electrically hydraulic control instead of mechanically hydraulic control which is conventionally used. The vehicle braking system, however, may not operate if a fault occurs in the battery.

To solve this problem, there is provided an auxiliary power supply which supplies electricity to the vehicle braking system at the time of battery failure in Patent Document 1, for example. FIG. 5 is a block circuit diagram of such a power supply device. The power supply device includes capacitor unit 101, which is composed, for example, of a plurality of electric double layer capacitors with large capacity and connected to each other as electric storage elements. Capacitor unit 101 is connected to charging circuit 103 and discharge circuit 105, which control the charging and discharging of capacitor unit 101, respectively. Charging circuit 103 and discharge circuit 105 are controlled by microcomputer 107. Microcomputer 107 is connected to voltage detector 109 which detects a failure of the battery. Voltage detector 109 is connected to FET switch 111 which supplies electricity stored in capacitor unit 101 to electronic control unit 117 at an emergency. Electric storage device 113 having this structure is connected between battery 115 and electronic control unit 117, and is started and stopped by ignition switch 119.

Electronic control unit 117 is a vehicle braking system. To ensure safety of the vehicle, electronic control unit 117 has to continue to operate even if battery 115 fails. Therefore, upon detection of the failure of battery 115 by voltage detector 109, microcomputer 107 turns on FET switch 111 to supply the electricity stored in capacitor unit 101 to electronic control unit 117. When the use of the vehicle is finished, microcomputer 107 controls discharge circuit 105 to discharge the electricity stored in capacitor unit 101, thereby suppressing a decrease in the property of capacitor unit 101.

Microcomputer 107 determines the property deterioration of capacitor unit 101 when ignition switch 119 is turned on to start the vehicle power supply device, which is required to be highly reliable. More specifically, the property deterioration is determined as follows. First, when the power supply device is started to charge capacitor unit 101, the internal resistance of capacitor unit 101 is measured either from the voltage measured at the start of the charging or from the voltage measured when the charging is interrupted. Next, the internal capacitance of capacitor unit 101 is calculated from the voltage change rate per unit time of capacitor unit 101 during the charge process. Microcomputer 107 then compares these values with the respective normal values, thereby determining the property deterioration of capacitor unit 101.

When started to charge capacitor unit 101, electric storage device 113 can determine the property deterioration of capacitor unit 101 and can also address the failure of battery 115. When, however, used as an emergency power supply device for instantaneous power failure, electric storage device 113 cannot fully determine the property deterioration because of the following reason. An emergency power supply device always has to have electricity for an instantaneous power failure that could occur at any time. Therefore, the property deterioration can be determined only when the emergency power supply device is initially started up, not while in use.

CITATION LIST

Patent Document

Patent Document 1: Japanese Patent Unexamined Publication No. 2005-28908

SUMMARY OF THE INVENTION

The present invention is directed to provide a highly reliable power supply device which can determine the property deterioration of its electric storage unit even while the power supply device is in use. The power supply device includes an electric storage unit, a charging circuit, a voltage detection circuit, a current detection circuit, a discharge circuit, and a control circuit. The electric storage unit stores electricity which a main power supply supplies to a load. The charging circuit charges the electric storage unit with the electricity supplied by the main power supply. The voltage detection circuit detects a voltage Vc of the electric storage unit. The current detection circuit detects a current Ic of the electric storage unit. The discharge circuit supplies electricity stored in the electric storage unit to the load. The control circuit controls the main power supply and the charging circuit, and reads a signal indicating the voltage Vc and a signal indicating the current Ic. When the voltage Vc is a predetermined steady-state voltage Vcs of the electric storage unit, the steady-state voltage (Vcs) being lower than a steady-state output voltage Vbs of the main power supply and higher than a driving lower-limit voltage Vfk at which the electric storage unit can drive the load, the control circuit determines whether or not the electric storage unit deteriorates in property with the following operations. The control circuit controls the charging circuit to charge the electric storage unit until the voltage Vc of the electric storage unit reaches the voltage for determining the property deterioration of the electric storage unit. A first internal resistance $R_1$ is calculated from a variation width $\Delta Vcr$ of the voltage Vc of the electric storage unit before and immediately after the charge process is started, and from a current Ic of the electric storage unit. Alternatively, a capacitance C is calculated from a variation width $\Delta Vct$ per unit time of the voltage Vc of the electric storage unit and from a current-time product $\int (Ic)dt$ of the electric storage unit per unit time during the charge process. Or, a second internal resistance $R_2$ is calculated from the variation width $\Delta Vcr$ of the voltage Vc of the electric storage unit before and after the charge process is interrupted, and from the current Ic of the electric storage unit. The control circuit determines whether or not the electric storage unit deteriorates in property by using at least one of the values.

With this structure, the electric storage unit is charged within the range not affecting the property deterioration while the power supply device is in use. Then, the internal resistance $R_1$ or $R_2$ of the electric storage unit is calculated from the variation width $\Delta Vcr$. The capacitance C of the electric storage unit is calculated from the variation width $\Delta Vct$ and the current-time product $\int (Ic)dt$ of the electric storage unit. At least one of these values can be calculated to determine the property deterioration of the electric storage unit even while the power supply device is in use. This improves the reliability of the power supply device.

DESCRIPTION OF EMBODIMENTS

Exemplary embodiments of the present invention will be described as follows with reference to the accompanied drawings. In the following description, a power supply device is used as an emergency power supply device for instantaneous power failure.

First Exemplary Embodiment

Figure 1:
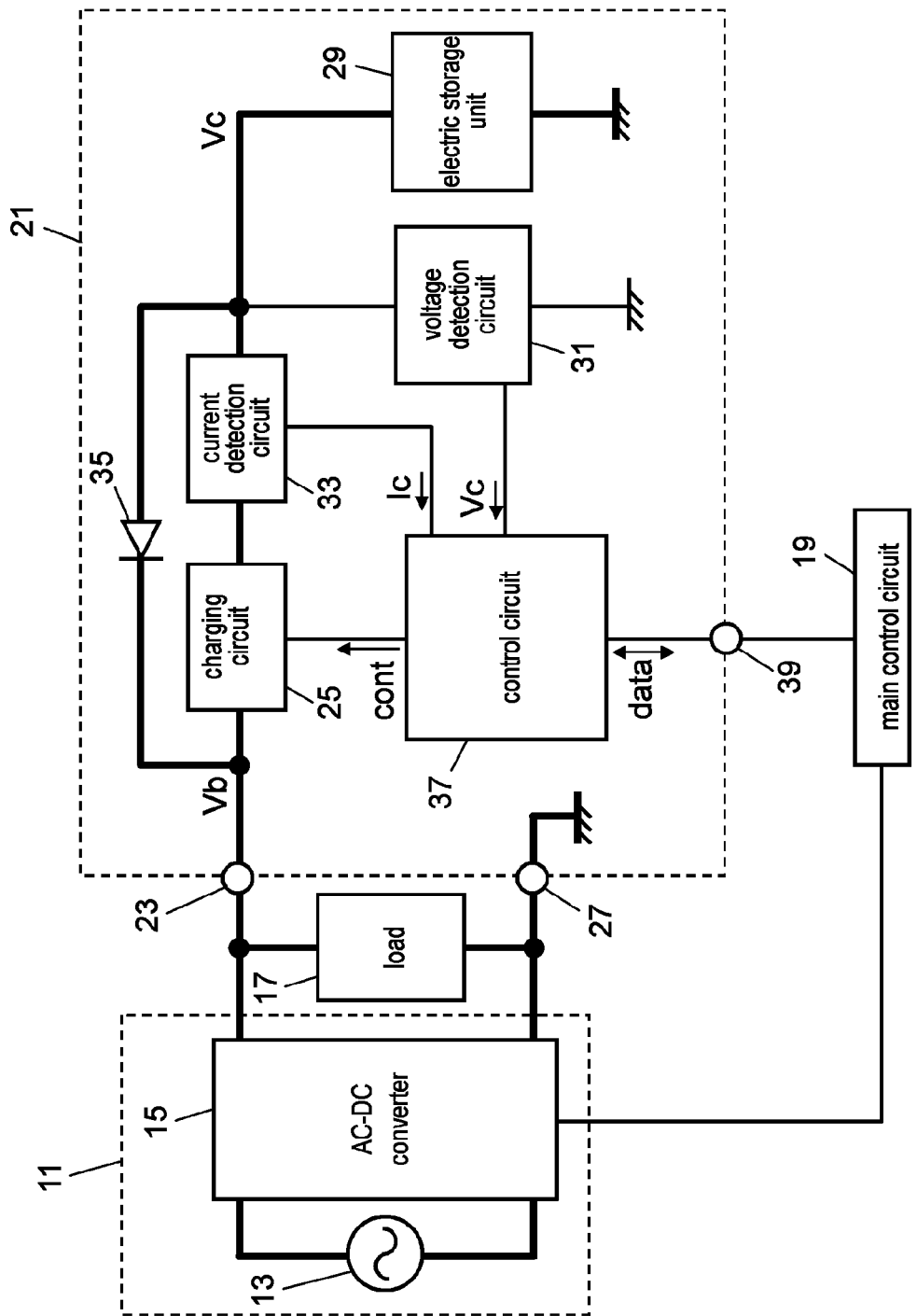
FIG. 1 is a block circuit diagram of a power supply device according to a first exemplary embodiment of the present invention.
Figure 2:
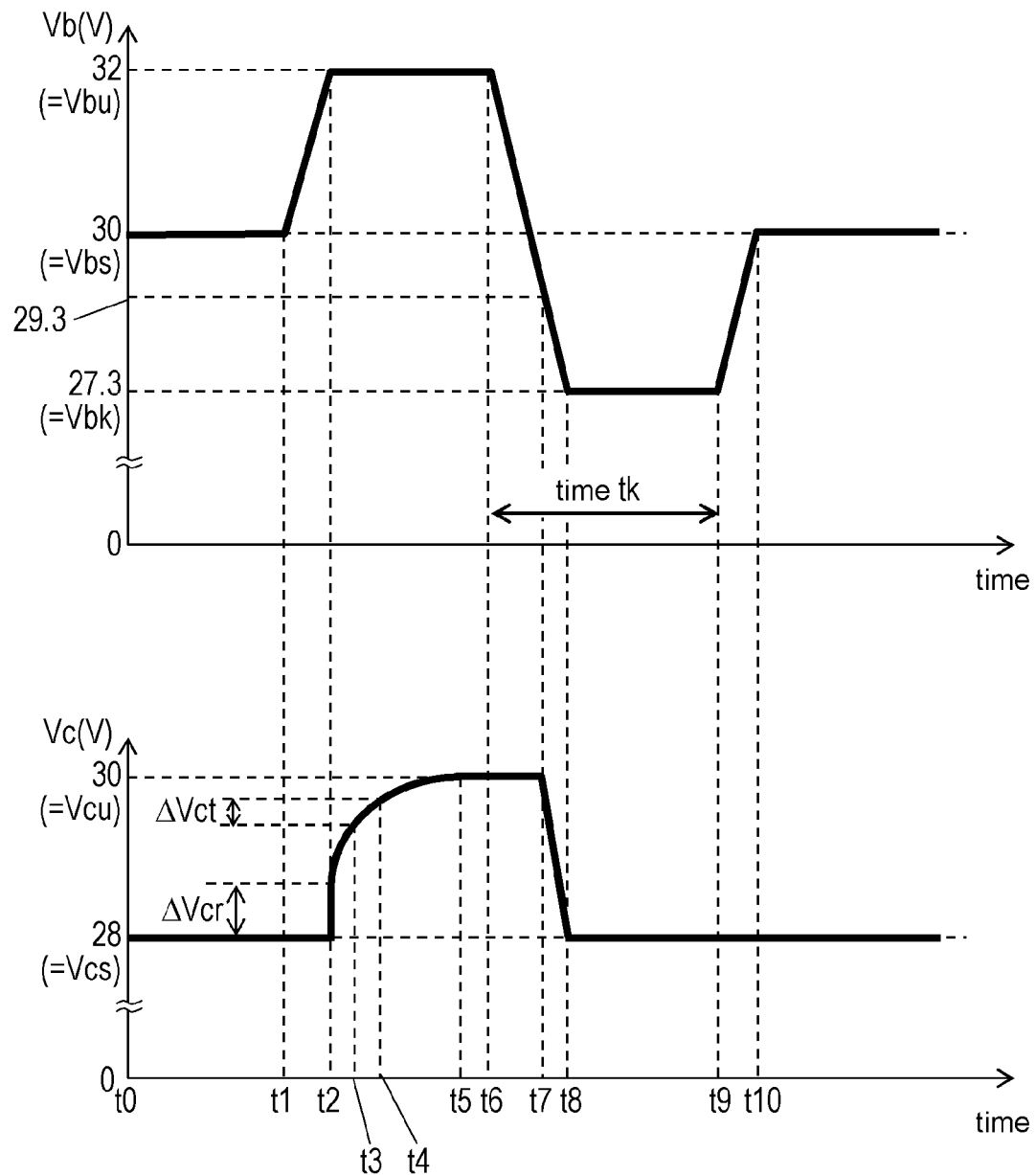
FIG. 2 is a characteristic diagram with time of an output voltage Vb and a voltage Vc of an electric storage unit used to determine the property deterioration of the electric storage unit of the power supply device shown in FIG. 1.

FIG. 1 is a block circuit diagram of a power supply device according to a first exemplary embodiment of the present invention. FIG. 2 is a characteristic diagram with time of an output voltage Vb and a voltage Vc of an electric storage unit used to determine whether or not the electric storage unit of the power supply device shown in FIG. 1 deteriorates in property (hereinafter referred as "determining the property deterioration of the electric storage unit"). In FIG. 1, the thick lines represent electrical wires, and the thin lines represent signal wires. In FIG. 2, the horizontal axis represents time.

Power supply device 21 includes electric storage unit 29, charging circuit 25, voltage detection circuit 31, current detection circuit 33, discharge circuit 35, and control circuit 37. Power supply device 21 is connected to main power supply 11.

Main power supply 11 converts AC power of commercial AC power supply 13 to DC power by AC-DC converter 15 and supplies it to load 17. In normal conditions, load 17 is operated by electricity supplied from main power supply 11. AC-DC converter 15 is connected to main control circuit 19 via a signal wire, allowing the output voltage Vb of main power supply 11 to be controlled by main control circuit 19. Load 17 is a device such as a mobile phone base station, which needs to continue to operate even when an instantaneous power failure occurs. Load 17 performs a normal operation, for example, at a voltage of 30V±5V. The intermediate value (30V) in the predetermined voltage range is referred to as a steady-state output voltage Vbs of main power supply 11.

Emergency power supply device 21 is electrically connected to main power supply 11 for instantaneous power failure thereof. More specifically, charging circuit 25 is electrically connected to main power supply 11 and load 17 via positive terminal 23. The negative electrode of main power supply 11 and the negative electrode of load 17 are electrically connected to ground terminal 27. Ground terminal 27 is connected to the ground of power supply device 21.

Charging circuit 25 is electrically connected to electric storage unit 29 which stores the electricity to be supplied from main power supply 11 to load 17. Charging circuit 25 charges electric storage unit 29 from main power supply 11 according to a current Ic of the electric storage unit detected by current detection circuit 33 and a voltage Vc of the electric storage unit detected by voltage detection circuit 31. Charging circuit 25 includes a diode for backflow prevention (not shown).

Electric storage unit 29 is composed of electric double layer capacitors with rapid charging-discharging characteristics for instantaneous power failure. The number of the electric double layer capacitors and the method for electrically connecting them are determined based on the frequency and length of an instantaneous power failure, the power consumption of load 17, and other conditions. Electric storage unit 29 is composed of series-connected 12 cells of electric double layer capacitors each having a rated voltage of 2.5V. In the steady state, charging circuit 25 makes electric storage unit 29 have a voltage (hereinafter, referred to as the steady-state voltage Vcs of the electric storage unit) of 28V. This voltage is lower than 30V (2.5V×12), which is the rated voltage of electric storage unit 29 (hereinafter referred to as the upper limit voltage Vcu of the electric storage unit). As a result, the progress of the property deterioration of electric storage unit 29 can be delayed compared with the case where the rated voltage is constantly applied.

The steady-state voltage Vcs of the electric storage unit is set at 28V as a default, which is lower than the steady-state output voltage Vbs (30V) of main power supply 11 and is higher than the driving lower-limit voltage Vfk (27V) at which electric storage unit 29 can drive load 17. The driving lower-limit voltage Vfk is a voltage Vc of the electric storage unit when electric storage unit 29 has minimum electricity required for electric storage unit 29 to supply electricity to load 17 throughout an instantaneous power failure. In the above-described structure, load 17 can be protected against instantaneous power failure when the steady-state voltage Vcs of the electric storage unit is equal to or higher than 27V, but charging up to 27V is a minimum level. Therefore, in the present exemplary embodiment, in consideration of a margin, the steady-state voltage Vcs of the electric storage unit (28V) is set higher than the driving lower-limit voltage Vfk (27V). The driving lower-limit voltage Vfk is set higher than the voltage (30V−5V=25V) at which load 17 cannot operate.

The steady-state output voltage Vbs and the upper limit voltage Vcu of the electric storage unit are both 30V in the following description, but they may have different values from each other.

Electric storage unit 29 is electrically connected to voltage detection circuit 31 which detects the voltage Vc of the electric storage unit. Voltage detection circuit 31 can be composed, for example, of two series-connected resistors (not shown), and outputs a voltage at their connection point as the voltage Vc.

Electric storage unit 29 is electrically connected via an electrical wire to current detection circuit 33 which detects the current Ic of the electric storage unit. Current detection circuit 33 can be basically composed, for example, of a shunt resistor and an operational amplifier (both not shown). The shunt resistor is connected in series to charging circuit 25 and electric storage unit 29. The operational amplifier detects the voltage across the shunt resistor. Current detection circuit 33 is connected between charging circuit 25 and electric storage unit 29 in FIG. 1, but may be structured in any other way as long as it is electrically connected to electric storage unit 29 via an electrical wire. Current detection circuit 33 may alternatively be a non-contact current detector composed, for example, of a Hall element magnetically connected to an electrical wire from electric storage unit 29.

Discharge circuit 35 is electrically connected in parallel to charging circuit 25. In FIG. 1, discharge circuit 35 is connected in parallel to a series circuit of charging circuit 25 and current detection circuit 33. Discharge circuit 35 supplies the electricity stored in electric storage unit 29 to load 17. Thus, the current does not pass through the shunt resistor of current detection circuit 33 when electricity stored in electric storage unit 29 is discharged to load 17. Therefore, this reduces the loss caused by the shunt resistor. In FIG. 1, discharge circuit 35 is composed of a diode whose cathode is connected to positive terminal 23. When an instantaneous power failure occurs in main power supply 11 and reduces the output voltage Vb, the electricity stored in electric storage unit 29 can be easily and automatically supplied to load 17.

Charging circuit 25, voltage detection circuit 31, and current detection circuit 33 are electrically connected to control circuit 37 via signal wires. Control circuit 37 is composed of a microcomputer and a peripheral circuit (both not shown). Control circuit 37 reads the signal indicating the voltage Vc of the electric storage unit from voltage detection circuit 31, and also reads the signal indicating the current Ic of the electric storage unit from current detection circuit 33. Control circuit 37 outputs a control signal "cont" to charging circuit 25 to control charging circuit 25. Furthermore, control circuit 37 is electrically connected to main control circuit 19 via data terminal 39 so as to transmit and receive various data signals "data" to/from main control circuit 19. Since main control circuit 19 is connected via a signal wire to AC-DC converter 15, control circuit 37 is electrically connected to main power supply 11. As a result, control circuit 37 can control main power supply 11 using the data signals "data".

Next, the operation of power supply device 21 will be described as follows. In normal conditions, electric storage unit 29 has electricity for instantaneous power failure. If an instantaneous power failure occurs, the output voltage Vb of main power supply 11 becomes lower than the voltage Vc of the electric storage unit. This turns on the diode of discharge circuit 35, allowing electricity stored in electric storage unit 29 to be supplied to load 17. Therefore, load 17 can continue to be driven even during the instantaneous power failure.

When the instantaneous power failure terminates, and the output voltage Vb returns to the steady-state output voltage Vbs (30V), discharge circuit 35 is turned off, and main power supply 11 supplies electricity to load 17. During this, control circuit 37 controls charging circuit 25 to charge electric storage unit 29 which was discharged during the instantaneous power failure, thereby preparing for the next instantaneous power failure.

Every time an instantaneous power failure occurs, power supply device 21 supplies electricity to load 17 so as to ensure stable operation of load 17.

The operation to determine the property deterioration of electric storage unit 29 will be described as follows also with reference to FIG. 2. The upper graph shows the temporal change of the output voltage Vb of main power supply 11, and the lower graph shows the temporal change of the voltage Vc of the electric storage unit.

At time t0, main power supply 11 is in a steady state, and is supplying electricity to load 17. Therefore, the output voltage Vb is at the steady-state output voltage Vbs, which is 30V in this case due to the specification of load 17, for example.

At time t0, the voltage Vc of the electric storage unit is 28V because the steady-state voltage Vcs of the electric storage unit is 28V. Thus, at time t0, electric storage unit 29 is charged up to the steady-state voltage Vcs (28V) of the electric storage unit, and the steady-state voltage Vcs is lower than the steady-state output voltage Vbs (30V) of main power supply 11 and is higher than the driving lower-limit voltage Vfk (27V) at which electric storage unit 29 can drive load 17.

At time t1, control circuit 37 starts the process of determining the property deterioration of electric storage unit 29. More specifically, control circuit 37 transmits a data signal "data" to main control circuit 19 so as to indirectly control the output voltage Vb of AC-DC converter 15 of main power supply 11 to be an upper output voltage Vbu.

The upper output voltage Vbu is a voltage outputted by main power supply 11 in order to charge electric storage unit 29 within the range not affecting the property deterioration. More specifically, to further charge electric storage unit 29, the upper output voltage Vbu is higher than the steady-state output voltage Vbs of main power supply 11. The upper output voltage Vbu, which is applied directly to load 17, also has to be equal to or lower than a driving upper-limit voltage Vfu of load 17. In this embodiment, the steady-state output voltage Vbs is 30V, and the driving upper-limit voltage Vfu is 35V (30V+5V), which is the upper limit of the normal driving voltage of load 17. Therefore, the upper output voltage Vbu is set, for example, to 32V to satisfy a relation of Vbs<Vbu≦Vfu.

Main power supply 11 is controlled such that the output voltage Vb starts to increase at time t1, reaches the upper output voltage Vbu at time t2, and then is maintained at this level. In FIG. 2, the output voltage Vb is controlled to increase with a slope from the steady-state output voltage Vbs to the upper output voltage Vbu. This slope prevents load 17 from operating unstably by a rapid change in the voltage applied thereto. In the case where load 17 is not made unstable by a change in the applied voltage, the slope can be steeper.

When the output voltage Vb reaches the upper output voltage Vbu at time t2, main control circuit 19 transmits the information of this occasion as a data signal "data" to control circuit 37. Upon receiving this information, control circuit 37 controls charging circuit 25 such that the voltage Vc temporarily reaches the upper limit voltage Vcu of the electric storage unit in order to determine the property deterioration of electric storage unit 29. The upper limit voltage Vcu is a voltage for determining the property deterioration of the electric storage unit. As a result, as shown in FIG. 2, electric storage unit 29 is charged from time t2 onward. Immediately after the charging is started, the voltage Vc of the electric storage unit sharply increases by a variation width $\Delta Vcr$. This is because at the instant when a charging current is supplied to electric storage unit 29, there occurs a voltage rise corresponding to internal resistances R.

Control circuit 37 reads the voltage Vc of the electric storage unit from voltage detection circuit 31 both immediately before and immediately after charging circuit 25 starts charging electric storage unit 29 at time t2. The difference between the two values of the voltage Vc is the variation width $\Delta Vcr$. Control circuit 37 also reads from current detection circuit 33 the current Ic of the electric storage unit which is supplied to electric storage unit 29 immediately after the charging is started. Control circuit 37 divides the variation width $\Delta Vcr$ by the current Ic of the electric storage unit based on the measurement results, thereby control circuit 37 can determine an internal resistance $R_1$ of electric storage unit 29.

Thereafter, control circuit 37 calculates a variation width $\Delta Vct$ per unit time of the voltage Vc and a current-time product $\int (Ic)dt$ of the electric storage unit between times t3 and t4 during the charge process. More specifically, the variation width ΔVct per unit time is calculated by making voltage detection circuit 31 detect the voltage Vc of the electric storage unit at times t3 and t4, and then their difference is calculated. The period between times t3 and t4 is stored as a unit period in a memory (not shown) embedded in control circuit 37. The current-time product ∫(Ic)dt of the electric storage unit, on the other hand, is calculated by time-integrating the current Ic of the electric storage unit detected by current detection circuit 33 between times t3 and t4. Control circuit 37 divides the current-time product ∫(Ic)dt of the electric storage unit by the variation width ΔVct per unit time, thereby control circuit 37 can calculate a capacitance C of electric storage unit 29.

From the internal resistance $R_1$ and the capacitance C of electric storage unit 29 thus calculated, control circuit 37 determines the property deterioration of electric storage unit 29. As the property deterioration of the electric double layer capacitors composing electric storage unit 29 proceeds, the internal resistance $R_1$ increases and the capacitance C decreases. Therefore, control circuit 37 can determine the property deterioration from these values. If the property of electric storage unit 29 is determined to be deteriorated, control circuit 37 outputs a signal indicating the property deterioration as the data signal "data" to main control circuit 19. This encourages the user to replace power supply device 21. When load 17 is a mobile phone base station, load 17 can inform its parent station of the property deterioration of electric storage unit 29. Although the property deterioration of electric storage unit 29 can be determined from either the internal resistance $R_1$ or the capacitance C of electric storage unit 29, the results can be more accurate by using both of them.

At time t5, the voltage Vc reaches the upper limit voltage Vcu of the electric storage unit (30V). Control circuit 37 controls charging circuit 25 to stop charging electric storage unit 29.

Thereafter, as the property deterioration of electric storage unit 29 is determined, control circuit 37 returns main power supply 11 and electric storage unit 29 to the steady state. More specifically, at time t6, control circuit 37 controls main power supply 11 to set the output voltage Vb to a lower output voltage Vbk, which is lower than the upper limit voltage Vcu of the electric storage unit and is equal to or higher than the driving lower-limit voltage Vfk. Through this procedure, electricity is discharged from electric storage unit 29 as will be described later, thereby decreasing the voltage Vc to be equal to or lower than the steady-state voltage Vcs of the electric storage unit. This extends the life of electric storage unit 29.

Here, the lower output voltage Vbk is described. The lower output voltage Vbk is a voltage to be outputted by main power supply 11 in order to discharge electric storage unit 29 to the steady-state voltage Vcs of the electric storage unit (28V) within the range not stopping load 17. More specifically, in order to discharge electric storage unit 29, the lower output voltage Vbk is made lower than the upper limit voltage Vcu of the electric storage unit (30V), which is the voltage Vc of the electric storage unit at time t6. The lower output voltage Vbk has to be equal to or higher than the driving lower-limit voltage Vfk (27V). If electric storage unit 29 is discharged too much, it becomes impossible to supply sufficient electricity to load 17 at an instantaneous power failure. Therefore, the lower output voltage Vbk is set so as to satisfy the relation Vfk≦Vbk<Vcu. When discharge circuit 35 is composed of a diode as described above, the diode has a voltage drop (for example, 0.7V). Thus, in order to decrease the voltage Vc down to the steady-state voltage Vcs of the electric storage unit (28V) after the discharge process, the lower output voltage Vbk is set to 27.3V (28V−0.7V) in consideration of the voltage drop (0.7V). This voltage satisfies the above-mentioned inequality.

Since discharge circuit 35 is composed of a diode in the present exemplary embodiment, the lower output voltage Vbk is uniquely determined by the voltage drop. If discharge circuit 35, on the other hand, includes a switch which is on-off controlled by control circuit 37, and a resistor, the lower output voltage Vbk is changed by a voltage drop caused by these components. Therefore, also in such a case, it is necessary to select and combine components to satisfy the relation Vfk≦Vbk<Vcu.

At time t6, the output voltage Vb of main power supply 11 starts to decrease toward the lower output voltage Vbk. At this moment, however, discharge circuit 35 is in the off state because the output voltage Vb is still higher than the voltage Vc of the electric storage unit. Therefore, from time t6 onward, the voltage Vc maintains to be the upper limit voltage Vcu of the electric storage unit.

Then, at time t7, the output voltage Vb reaches 29.3V, and discharge circuit 35 is turned on. The voltage of 29.3V is determined by subtracting the voltage drop (0.7V) of discharge circuit 35 from the voltage Vc of the electric storage unit (30V until immediately before time t7). Therefore, the electricity stored in electric storage unit 29 is supplied to load 17 via discharge circuit 35. As a result, the voltage Vc of the electric storage unit decreases with time with decreasing the output voltage Vb.

At time t8, the output voltage Vb reaches the lower output voltage Vbk (27.3V). At this time, main power supply 11 is controlled such that the output voltage Vb is maintained to be the lower output voltage Vbk. As a result, the voltage Vc reaches the steady-state voltage Vcs of the electric storage unit (28V). At this moment, the difference between the output voltage Vb and the voltage Vc of the electric storage unit is substantially equal to the voltage drop of the diode, thereby turning off discharge circuit 35. After this, the voltage Vc is maintained to be the steady-state voltage Vcs of the electric storage unit.

Meanwhile, the output voltage Vb is controlled to decrease with a slope from the upper output voltage Vbu to the lower output voltage Vbk between times t6 and t8 because of the same reason as between times t1 and t2.

At time t9, a predetermined period "tk" has passed since time t6 (at which a discharge process is started). The predetermined period "tk" is preset as a sufficient time period until the output voltage Vb reaches the lower output voltage Vbk, and until the voltage Vc reaches the steady-state voltage Vcs of the electric storage unit. The predetermined period "tk" can be, for example, five seconds, and starts to be counted at time t6 by a timer (not shown) of control circuit 37.

When the predetermined period "tk" passed at time t9, the voltage Vc is already at the steady-state voltage Vcs of the electric storage unit. Then, control circuit 37 controls main power supply 11 to return the output voltage Vb to the steady-state output voltage Vbs (30V) via main control circuit 19. The output voltage Vb is thus increased with time, and returns to the steady-state output voltage Vbs at time t10. Between times t9 and t10, discharge circuit 35 remains in the off state because the voltage Vc remains to be the steady-state voltage Vcs of the electric storage unit (28V), and is lower than the output voltage Vb. As a result, the voltage Vc of the electric storage unit remains at the steady-state voltage Vcs.

At time t10, both the output voltage Vb and the voltage Vc of the electric storage unit return to the conditions of time t0, thereby the process of determining the property deterioration is finished.

Since electric storage unit 29 always has electricity during the process of determining the property deterioration, the determination is preferably performed as the property deterioration of electric storage unit 29 proceeds. More specifically, it is preferable that control circuit 37 determine the property deterioration of electric storage unit 29 at a predetermined time interval "ti". The predetermined time interval "ti" can be, for example, one day, meaning that the property deterioration of electric storage unit 29 is determined at a frequency of once per day. The predetermined time interval "ti" can be made shorter than one day, but this is not necessary because the property deterioration of electric storage unit 29 generally proceeds slowly. If the predetermined time interval "ti" is too long, on the other hand, the property deterioration may be detected too late. Therefore, the adequate predetermined time interval "ti" is one day.

As apparent from FIG. 2, the output voltage Vb fluctuates between the upper output voltage Vbu (32V) and the lower output voltage Vbk (27.3V) during the process of determining the property deterioration. This voltage fluctuation does not affect the operation of load 17 because load 17 is predetermined to operate within 30V±5V as mentioned above.

When an instantaneous power failure occurs between the start (time t1) and the end (time t10) of the process of determining the property deterioration, control circuit 37 detects that the output voltage Vb has decreased to the lower output voltage Vbk, from AC-DC converter 15 via main control circuit 19. Control circuit 37 then immediately stops the process of determining the property deterioration. When the output voltage Vb decreases to the lower output voltage Vbk (27.3V), the voltage Vc of the electric storage unit becomes higher. This is because the voltage Vc is equal to or higher than 28V as shown in FIG. 2 even while the property deterioration is in the process of being determined. As a result, discharge circuit 35 is turned on, and supplies electricity stored in electric storage unit 29 to load 17. Thus, when an instantaneous power failure occurs, electricity stored in electric storage unit 29 can be supplied to load 17 with above-mentioned process even when the property deterioration is the process of being determined.

With the above-described structure and operation, the property deterioration of electric storage unit 29 can be determined even when power supply device 21 is in use and electric storage unit 29 is in a charged state.

The output voltage Vb of main power supply 11 is returned from the lower output voltage Vbk to the steady-state output voltage Vbs at time t9 when the predetermined period "tk" has passed since the discharge process was started (time t6) in the present exemplary embodiment. It is alternatively possible, however, to continue to detect the voltage Vc of the electric storage unit from time t6 onward instead of calculating the predetermined period "tk", and then to return the output voltage Vb to the steady-state output voltage Vbs when the output voltage Vb becomes equal to or lower than the steady-state voltage Vcs of the electric storage unit. In this case, the voltage Vc of the electric storage unit has to continue to be detected, but the output voltage Vb can be timely returned to the steady-state output voltage Vbs, thereby reducing the time required for the determination of the property deterioration. When the voltage Vc becomes lower than the steady-state voltage Vcs of the electric storage unit, control circuit 37 can control charging circuit 25 such that the voltage Vc reaches the steady-state voltage Vcs of the electric storage unit.

The voltage for determining the property deterioration of the electric storage unit is the upper limit voltage Vcu of the electric storage unit in the present exemplary embodiment. In this case, it is unnecessary to limit the frequency of the determination of the property deterioration. This, however, slightly reduces the electricity supplied by electric storage unit 29, thereby slightly reducing the backup time, for example.

On the other hand, in the case where the voltage for determining the property deterioration of the electric storage unit is set higher than the upper limit voltage Vcu of the electric storage unit, the electric power supply can be increased. The property of electric storage unit 29, however, decreases based on a cumulative sum of the product of the voltage exceeding the rated voltage and its duration at every determination of the property deterioration, and a cumulative sum of the frequency of the property deterioration. More specifically, electric storage unit 29 does not deteriorate in property suddenly when the voltage for determining the property deterioration temporarily exceeds the upper limit voltage Vcu of the electric storage unit, which is the rated voltage of electric storage unit 29, but deteriorates based on the cumulative sum of the voltage exceeding the rated voltage and its duration. To avoid this, the frequency of determining the property deterioration has to be limited, thereby decreasing the accuracy of determining the property deterioration. Therefore, in terms of practicality, the voltage for determining the property deterioration of the electric storage unit is preferably not more than 1.1 times the upper limit voltage Vcu of the electric storage unit.

Second Exemplary Embodiment

Figure 3:
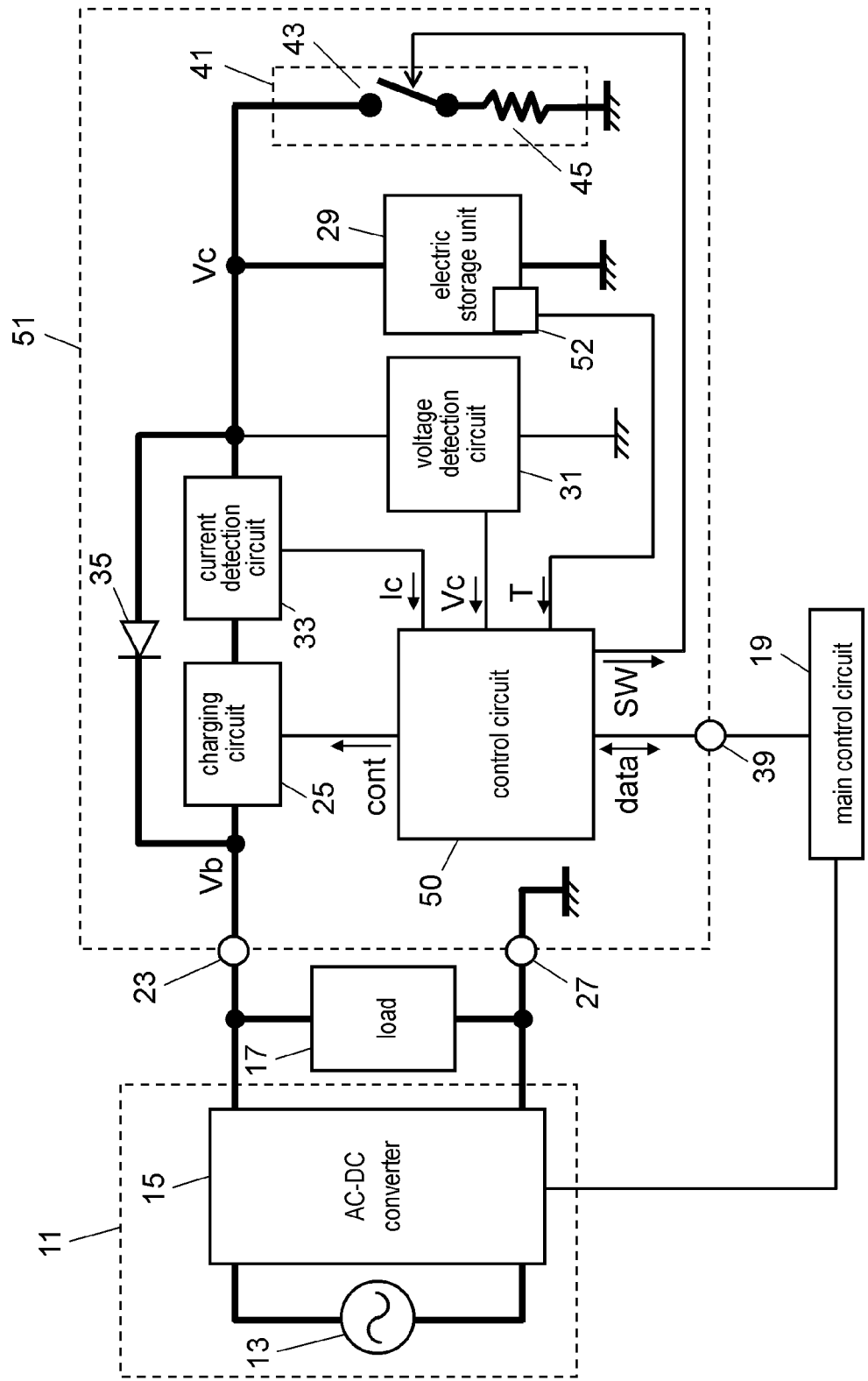
FIG. 3 is a block circuit diagram of a power supply device according to a second exemplary embodiment of the present invention.
Figure 4:
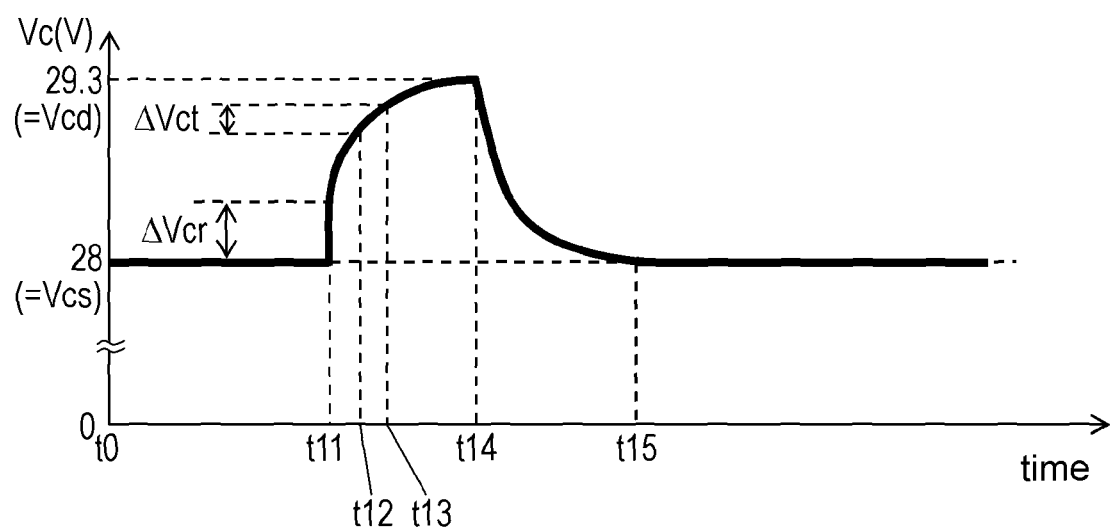
FIG. 4 is a characteristic diagram with time of a voltage Vc of an electric storage unit used to determine the property deterioration of the electric storage unit of the power supply device shown in FIG. 3.
Figure 5:
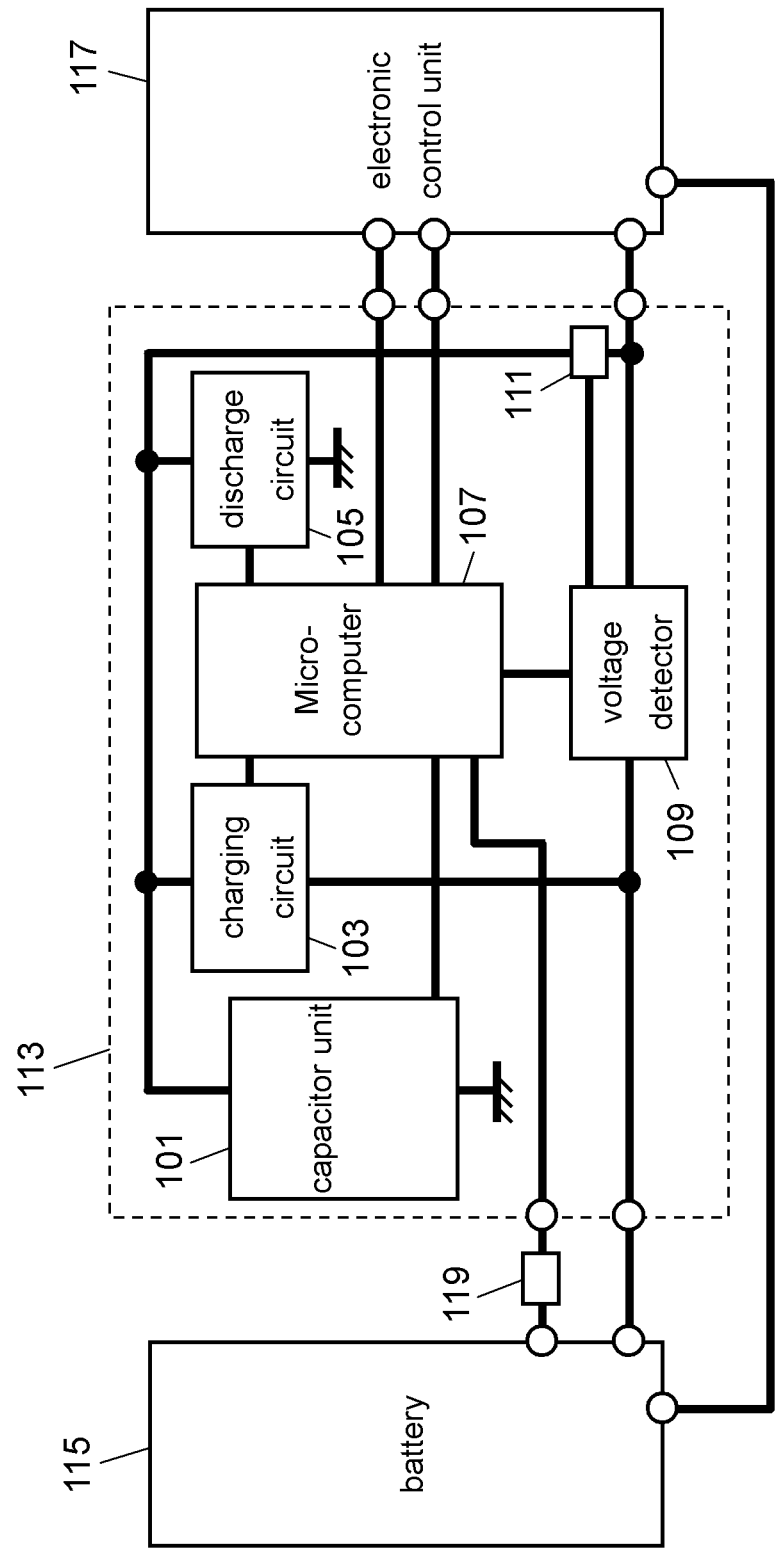
FIG. 5 is a block circuit diagram of a conventional power supply device.

FIG. 3 is a block circuit diagram of a power supply device according to a second exemplary embodiment of the present invention. FIG. 4 is a characteristic diagram with time of a voltage Vc of an electric storage unit used to determine the property deterioration of the power supply device shown in FIG. 3. In FIG. 3, the thick lines represent electrical wires, and the thin lines represent signal wires. In FIG. 4, the vertical axis represents the voltage Vc of the electric storage unit.

In FIG. 3, like components are labeled with like reference numerals with respect to FIG. 1, and these components are not described again in detail. Power supply device 51 includes electric storage unit 29, charging circuit 25, voltage detection circuit 31, current detection circuit 33, discharge circuit 35, control circuit 50, and discharge circuit 41 for the electric storage unit. Power supply device 51 is connected to main power supply 11. In other words, the present exemplary embodiment is characterized in that electric storage unit 29 is electrically connected in parallel to discharge circuit 41 for the electric storage unit.

Discharge circuit 41 for the electric storage unit is composed of discharge switch 43 and discharge resistor 45 connected to each other in series. Discharge switch 43 is on-off controlled by an on-off signal SW from control circuit 50. More specifically, discharge switch 43 can be composed of a field effect transistor, other semiconductor switch, a relay, or other devices.

In the circuit diagram, control circuit 50, which is electrically connected to discharge circuit 41 for the electric storage unit via a signal wire, can arbitrarily control the discharge of electric storage unit 29.

The following is a description of the operation of power supply device 51. The operation under normal conditions is not described in detail again because it is identical to that in the first exemplary embodiment. The process of determining the property deterioration of electric storage unit 29, which is the feature of the present exemplary embodiment, will be described as follows with reference to FIG. 4.

In FIG. 4, at time t0, power supply device 51 is in a steady state in the same manner as in FIG. 2. Electric storage unit 29 has thus been charged up to the steady-state voltage Vcs of the electric storage unit (28V). At time t11, control circuit 50 starts the process of determining the property deterioration of electric storage unit 29. More specifically, control circuit 50 controls charging circuit 25 such that the voltage Vc of the electric storage unit becomes lower than the output voltage Vb of main power supply 11. Control circuit 50 then controls charging circuit 25 to charge electric storage unit 29 until the voltage Vc of the electric storage unit reaches a voltage Vcd for determining the property deterioration of the electric storage unit. The voltage Vc of the electric storage unit is detected by voltage detection circuit 31.

When the voltage Vcd for determining the property deterioration of the electric storage unit is determined to be equal to or higher than the steady-state output voltage Vbs, discharge circuit 35 may be turned on. If discharge circuit 35 is turned on, the voltage Vc of the electric storage unit may not reach the voltage Vcd for determining the property deterioration of the electric storage unit. As a result, the process of determining the property deterioration becomes endless. To reduce this possibility, when the output voltage Vb of main power supply 11 is controlled to the steady-state output voltage Vbs, the voltage Vcd for determining the property deterioration of the electric storage unit is set lower than the steady-state output voltage Vbs (30V). More specifically, charging circuit 25 includes a diode for backflow prevention as described in the first exemplary embodiment, and the voltage Vcd for determining the property deterioration of the electric storage unit is set to a value (30V−0.7V=29.3V) obtained by subtracting the voltage drop (0.7V) from the steady-state output voltage Vbs.

At time t11, control circuit 50 calculates the variation width $\Delta Vcr$ in the same manner as at time t2 of FIG. 2. Control circuit 50 also reads the current Ic of the electric storage unit from current detection circuit 33. Control circuit 50 detects the internal resistance $R_1$ of electric storage unit 29 from these measurement values in the same manner as in the first exemplary embodiment.

During the charging time period between times t12 and t13, control circuit 50 calculates the variation width $\Delta Vct$ per unit time of the voltage Vc of the electric storage unit and the current-time product $\int(Ic)dt$ of the electric storage unit. These values are calculated in the same manner as in the first exemplary embodiment. Control circuit 50 also calculates the capacitance C of electric storage unit 29 based on these values in the same manner as in the first exemplary embodiment.

Control circuit 50 determines the property deterioration of electric storage unit 29 in the same manner as in the first exemplary embodiment from the internal resistance $R_1$ and the capacitance C thus obtained.

At time t14 in FIG. 4, the voltage Vc of the electric storage unit reaches the voltage Vcd for determining the property deterioration of the electric storage unit. At this moment, the process of determining the property deterioration is already over. Control circuit 50 thus controls the voltage Vc of the electric storage unit to be lower than the output voltage Vb of main power supply 11. Control circuit 50 also controls discharge circuit 41 for the electric storage unit to discharge electric storage unit 29 until the voltage Vc reaches the steady-state voltage Vcs of the electric storage unit. More specifically, main control circuit 19 controls main power supply 11 such that the output voltage (Vb) of main power supply 11 reaches the steady-state output voltage (Vbs), and control circuit 50 turns on discharge switch 43. As a result, the electricity charged in electric storage unit 29 for the determination of the property deterioration is discharged by discharge resistor 45.

Thereafter, control circuit 50 monitors the voltage Vc of the electric storage unit by voltage detection circuit 31. When the voltage Vc reaches the steady-state voltage Vcs of the electric storage unit at time t15, control circuit 50 turns off discharge switch 43. As a result, the voltage Vc maintains to be at the steady-state voltage Vcs of the electric storage unit. At time t15, the voltage Vc of the electric storage unit returns to the conditions of time t0, and the process of determining the property deterioration is terminated.

The process of determining the property deterioration is carried out at a predetermined time interval "ti" (for example, one day) in the same manner as in the first exemplary embodiment.

The present exemplary embodiment has a more complicated structure than the first exemplary embodiment because of the presence of discharge circuit 41 for the electric storage unit. In the present exemplary embodiment, however, it is unnecessary to change the output voltage Vb of main power supply 11, thereby simplifying the control structure, and reducing the voltage fluctuation of load 17 caused by the determination of the property deterioration.

If an instantaneous power failure occurs between the start (time t11) and the end (time t15) of the process of determining the property deterioration, control circuit 50 immediately stops this process in the same manner as in the first exemplary embodiment. At this moment, the voltage Vc of the electric storage unit becomes higher than the output voltage Vb which is decreased by the instantaneous power failure. This is because as shown in FIG. 4, the voltage Vc of the electric storage unit remains to be equal to or higher than 28V even when determining the property deterioration is in the process. Accordingly, discharge circuit 35 is turned on, and discharge switch 43 is in the ON state between times t14 and t15. Therefore, control circuit 50 turns off discharge switch 43 immediately after the instantaneous power failure occurs. This allows the electricity charged for the determination of the property deterioration to be supplied to load 17, thereby decreasing the voltage Vc of the electric storage unit earlier than discharge circuit 41 for the electric storage unit discharges electricity storage unit 29. Moreover, if an instantaneous power failure occurs, electric storage unit 29 can supply electricity to load 17 even when determining the property deterioration is in the process.

With the above-described structure and operation, the property deterioration of electric storage unit 29 can be determined even when power supply device 51 is in use and electric storage unit 29 is in a charged state.

The variation width $\Delta Vcr$ is calculated immediately after electric storage unit 29 is started to be charged in the first and second exemplary embodiments. Alternatively, it is possible to interrupt the charge process, and to calculate the variation width $\Delta Vcr$ from the voltage Vc of the electric storage unit before or after the interruption. In this case, the voltage Vc is detected at a certain time point while electric storage unit 29 is being charged for the determination of the property deterioration, and then a decreased voltage Vc is detected immediately after the charge process is interrupted. The difference (decrease width) in the voltage Vc between these two time points can be used as the variation width $\Delta Vcr$ to calculate an internal resistance $R_2$. The length of the interruption can be, for example, 0.1 second, which allows voltage detection circuit 31 to stably detect the voltage Vc. Alternatively, it is possible to interrupt the charge process before detecting the voltage Vc, and then to detect an increased voltage Vc immediately after the charge process is resumed. The increase width is proportional to the internal resistance $R_2$ of electric storage unit 29 in the same manner as the decrease width, the difference between the two time points in the voltage Vc of the electric storage unit may be calculated as the variation width ΔVcr. When the voltages at the two time points are detected, it is also necessary to detect the current Ic of the electric storage unit. Thus, the internal resistance can be calculated from the variation width ΔVcr, which is calculated by interrupting the charge process.

The current Ic of the electric storage unit is charged to electric storage unit 29. Control circuit 50 can control the current Ic to be increased only when the internal resistance is calculated, by using current detection circuit 33. This increases the variation width ΔVcr, thereby providing highly accurate detection.

As described above, control circuits 37 and 50 calculate at least one of the internal resistance $R_1$, the capacitance C, and the internal resistance $R_2$ of electric storage unit 29. The internal resistance $R_1$ is calculated from the variation width ΔVcr of the voltage Vc of the electric storage unit before and immediately after the charge process is started, and the current Ic of the electric storage unit. The capacitance C is calculated from the variation width ΔVct per unit time of the voltage Vc of the electric storage unit during the charge process, and the current-time product ∫(Ic)dt of the electric storage unit per unit time. The internal resistance $R_2$ is calculated from the variation width ΔVcr of the voltage Vc of the electric storage unit before and after the charge process is interrupted, and from the current Ic of the electric storage unit. Control circuits 37 and 50 determine the property deterioration from at least one of these values.

In the first and second exemplary embodiments, electric storage unit 29 is charged with a constant resistance controlled at a constant voltage from the beginning as shown in times t2 to t5 of FIG. 2, and in times t11 to t14 of FIG. 4. This simplifies the control of the charge process, but requires complex calculation because of the following reason. The voltage Vc of the electric storage unit changes exponentially with time, so that the capacitance C of electric storage unit 29 has to be calculated by time-integrating the current Ic of the electric storage unit.

To avoid this inconvenience, charging circuit 25 may be under constant current/constant voltage control (hereinafter, CCCV control) using current detection circuit 33. In this case, electric storage unit 29 is charged at a constant current until the charging target voltage is reached. The temporal change of the voltage Vc of the electric storage unit becomes substantially linear in times t2 to t5 of FIG. 2 and in times t11 to t14 of FIG. 4. As a result, the current-time product ∫(Ic)dt of the electric storage unit can be calculated by a simple formula "Ic×Δt". The Δt represents the time period between times t3 and t4, or between times t12 and t13. The current Ic of the electric storage unit, which is used to calculate the variation width ΔVcr, has to be also detected to calculate the internal resistances R. In the case of CCCV control, however, the current Ic of the electric storage unit is a known constant value, which is used to calculate the variation width ΔVcr. Therefore, the property deterioration can be determined without detecting the current Ic of the electric storage unit.

In the first and second exemplary embodiments, power supply devices 21 and 51 are used as emergency power supply devices in mobile phone base stations. Since a base station is installed indoors where the temperature is stable, the determination of the property deterioration of electric storage unit 29 is not affected by the temperature. On the other hand, if power supply devices 21 and 51 are used in other places where the temperature is unstable, for example, outdoors or in vehicles, it may be impossible to properly determine the property deterioration because the internal resistances R and the capacitance C of electric storage unit 29 have temperature dependency. In such a case, electric storage unit 29 is provided with a temperature sensor electrically connected to control circuit 37 or 50 via a signal wire. FIG. 3 shows temperature sensor 52 connected to control circuit 50, but temperature sensor 52 may be provided in the structure of FIG. 1. When control circuits 37 and 50 determine the property deterioration, temperature sensor 52 detects a temperature T of electric storage unit 29, and can correct the internal resistances $R_1$ and $R_2$ and the capacitance C based on their correlation with the temperature T. When the temperature T decreases, the internal resistances $R_1$ and $R_2$ increase, and the capacitance C decreases. Therefore, their correlations are prestored in the memory. When the property deterioration is determined, the temperature T is detected from temperature sensor 52, and is used to correct the calculated internal resistances $R_1$ and $R_2$ and capacitance C based on their correlation. As a result, the property deterioration can be determined with higher accuracy, thereby improving reliability. Since the property deterioration can be determined from at least one of the internal resistances $R_1$ and R, and the capacitance C as described above, only the value used for the determination may be corrected.

Electric storage unit 29 is composed of electric double layer capacitors as electric storage elements in the first and second exemplary embodiments, but may alternatively be composed of other capacitors such as electrochemical capacitors.

Power supply device 51 is used as an emergency power supply device in the first and second exemplary embodiments, but may alternatively be used as a back-up power supply for vehicles and other applications, or as an auxiliary power supply.

INDUSTRIAL APPLICABILITY

The power supply device of the present invention is reliable because it can determine the property deterioration of the electric storage unit even during use. It is useful especially as a power supply device for supplying electricity stored in the electric storage unit when the main power supply suffers a voltage drop.

The invention claimed is:

1. A power supply device comprising:
   an electric storage unit for storing electricity which a main power supply supplies to a load;
   a charging circuit for charging the electric storage unit with the electricity supplied by the main power supply;
   a voltage detection circuit for detecting a voltage (Vc) of the electric storage unit;
   a current detection circuit for detecting a current (Ic) of the electric storage unit;
   a discharge circuit for supplying electricity stored in the electric storage unit to the load; and
   a control circuit for controlling the main power supply and the charging circuit, and for reading a signal indicating the voltage (Vc) of the electric storage unit and a signal indicating the current (Ic) of the electric storage unit, wherein
   when the voltage (Vc) of the electric storage unit is a predetermined steady-state voltage (Vcs) of the electric storage unit, the steady-state voltage (Vcs) being lower than a steady-state output voltage (Vbs) of the main power supply and higher than a driving lower-limit voltage (Vfk) at which the electric storage unit can drive the load, the control circuit controls the charging circuit to charge the electric storage unit until the voltage (Vc) of the electric storage unit reaches a voltage (Vcu, Vcd) for determining whether or not the electric storage unit deteriorates in property by using at least one of a first internal resistance ($R_1$), a capacitance (C), and a second internal resistance ($R_2$) of the electric storage unit, where the first internal resistance ($R_1$) is calculated from a variation width (ΔVcr) of the voltage (Vc) of the electric storage unit before and immediately after the charge process is started, and from a current (Ic) of the electric storage unit, the capacitance (C) is calculated from a variation width (ΔVct) per unit time of the voltage (Vc) of the electric storage unit and from a current-time product (∫(Ic)dt) of the electric storage unit per unit time during the charge process, and the second internal resistance ($R_2$) is calculated from the variation width (ΔVcr) of the voltage (Vc) of the electric storage unit before and after the charge process is interrupted, and from the current (Ic) of the electric storage unit.

2. The power supply device of claim 1, wherein
the voltage (Vcd) for determining the property deterioration of the electric storage unit is lower than the steady-state output voltage (Vbs) of the main power supply.

3. The power supply device of claim 2, further comprising a discharge circuit for the electric storage unit, the discharge circuit being electrically connected in parallel with the electric storage unit, wherein upon determining the property deterioration, the control circuit controls the discharge circuit for the electric storage unit to discharge the electric storage unit until the voltage (Vc) of the electric storage unit reaches the steady-state voltage (Vcs) of the electric storage unit.

4. The power supply device of claim 1, wherein
when the voltage (Vc) of the electric storage unit is the predetermined steady-state voltage (Vcs) of the electric storage unit, the steady-state voltage (Vcs) being lower than the steady-state output voltage (Vbs) of the main power supply and higher than the driving lower-limit voltage (Vfk) at which the electric storage unit can drive the load, the control circuit controls the main power supply such that the output voltage (Vb) of the main power supply can be an upper output voltage (Vbu), which is higher than the steady-state output voltage (Vbs) and is not higher than a driving upper-limit voltage (Vfu) of the load.

5. The power supply device of claim 4, wherein
the voltage for determining the property deterioration of the electric storage unit is an upper limit voltage (Vcu) of the electric storage unit.

6. The power supply device of claim 4, wherein
upon determining the property deterioration, the control circuit controls the main power supply such that the output voltage (Vb) of the main power supply can be a lower output voltage (Vbk), which is lower than the upper limit voltage (Vcu) of the electric storage unit and is not lower than the driving lower-limit voltage (Vfk); and when a predetermined period (tk) has passed or when the voltage (Vc) of the electric storage unit becomes not higher than the steady-state voltage (Vcs) of the electric storage unit, the control circuit controls the main power supply such that the output voltage (Vb) can be returned to the steady-state output voltage (Vbs).

7. The power supply device of claim 1, wherein
the control circuit determines the property deterioration at a predetermined time interval (ti).

8. The power supply device of claim 1, wherein
when the output voltage (Vb) is lowered to the lower output voltage (Vbk) during a process of determining the property deterioration, the control circuit interrupts the process of determining the property deterioration, and controls the discharge circuit to supply the electricity stored in the electric storage unit to the load.

9. The power supply device of claim 1, further comprising a temperature sensor for measuring a temperature of the electric storage unit, the temperature sensor being electrically connected to the control circuit, wherein when determining the property deterioration, the control circuit detects a temperature (T) of the electric storage unit via the temperature sensor, and corrects at least one of the first and second internal resistances ($R_1$, $R_2$) and the capacitance (C), which are to be used for the determination of the property deterioration based on a correlation with the temperature (T).

10. The power supply device of claim 1, wherein
when a determination result of the property deterioration indicates that the property of the electric storage unit has deteriorated, the control circuit outputs a signal indicating the property deterioration.

* * * * *